United States Patent [19]
Ozawa et al.

[11] Patent Number: 4,589,026
[45] Date of Patent: May 13, 1986

[54] IMAGE SENSOR

[75] Inventors: Takashi Ozawa; Mutsuo Takenouchi, both of Ebina, Japan

[73] Assignee: Fuji Xerox Co., Ltd., Japan

[21] Appl. No.: 521,104

[22] Filed: Aug. 8, 1983

[30] Foreign Application Priority Data

Aug. 16, 1982 [JP] Japan .................... 57-141826

[51] Int. Cl.$^4$ .................................... H04N 1/10
[52] U.S. Cl. ........................ 358/213; 358/212
[58] Field of Search ................. 358/212, 213; 357/24 LR

[56] References Cited

U.S. PATENT DOCUMENTS

| | | | |
|---|---|---|---|
| 3,683,193 | 8/1972 | Weimer | 357/24 LR |
| 4,324,988 | 4/1982 | Takemura | 357/24 LR |
| 4,353,084 | 10/1982 | Herbst | 357/24 LR |
| 4,419,696 | 12/1983 | Hamano | 357/24 LR |
| 4,449,147 | 5/1984 | Ogasawara | 358/213 |
| 4,450,464 | 5/1984 | Yamada | 357/24 LR |
| 4,500,927 | 2/1985 | Ozawa | 357/24 LR |

*Primary Examiner*—Gene Z. Rubinson
*Assistant Examiner*—L. C. Schroeder
*Attorney, Agent, or Firm*—Handal & Morofsky

[57] ABSTRACT

In the image sensor, thin film transistors are provided in the one-to-one correspondence to the photoelectric conversion element these thin film transistors being divided into blocks of adjoining ones whose gate electrodes are mutually connected, and the switching signal is sequentially supplied to each mutually connected gate electrodes of the same block. Further, the output electrodes of those thin film transistors located in the corresponding positions in each odd and even numbered blocks are mutually connected, and the charge transfer circuits comprising the MOS transistors are provided corresponding to respective common connection line groups of odd numbered block and even numbered block. By this construction, at the time of picking up the outputs of the photoelectric conversion elements, the switching period for the thin film transistors can be retained as long as the original reading time of a plurality of the photoelectric conversion elements corresponding to a plurality of the thin film transistors whose gate electrodes are mutually connected, and therefore the speed of outputting read signal is determined soley by the MOS transistor switching speed. In addition, the number of the connection lines required may be as small as the number of the common connection lines.

7 Claims, 4 Drawing Figures

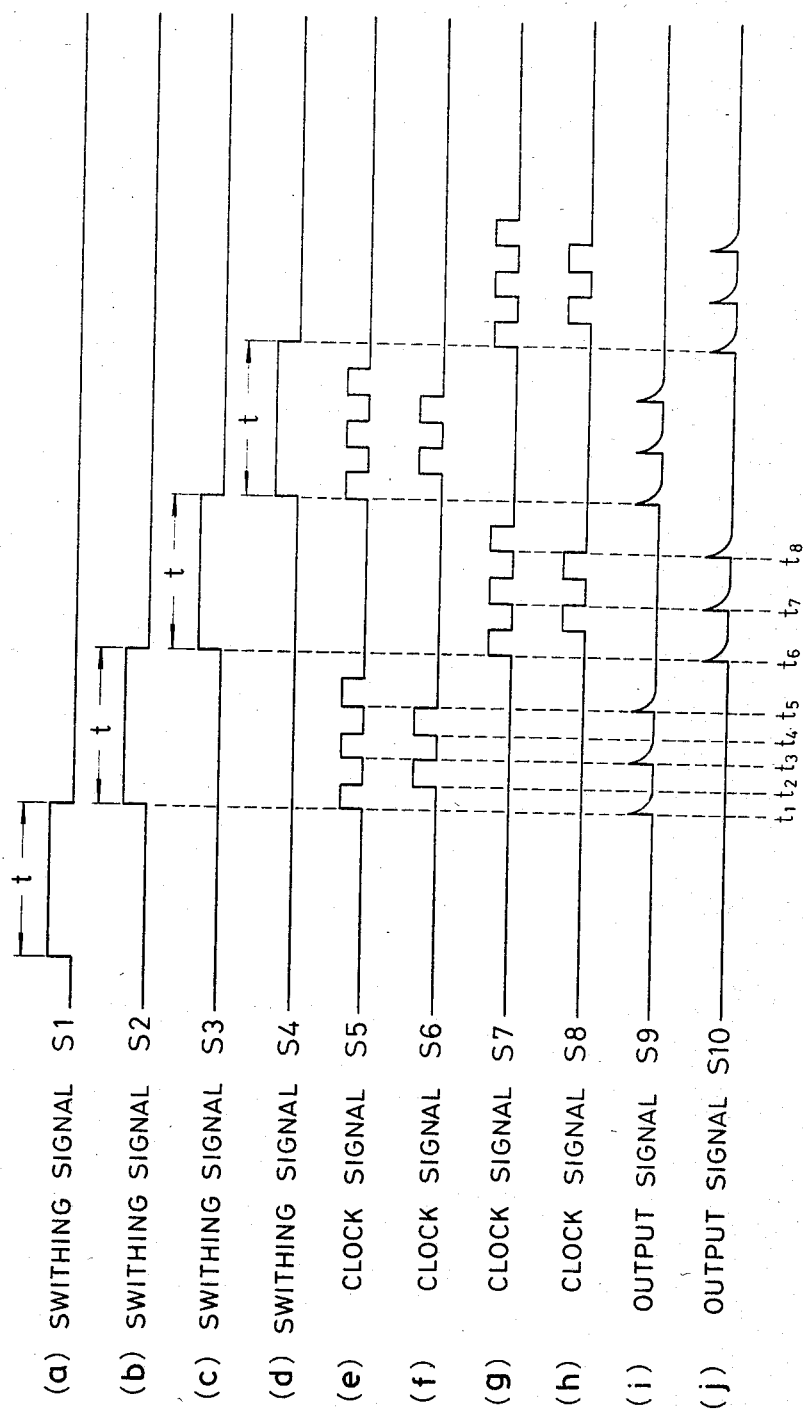

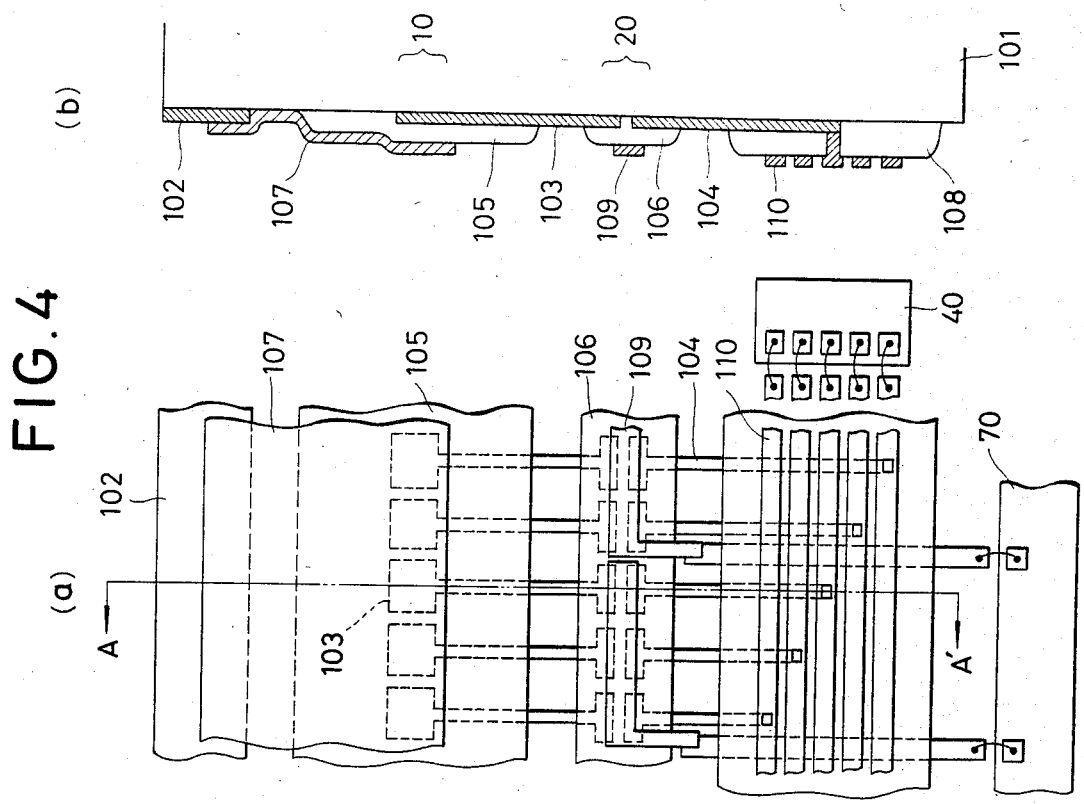

IMAGE SENSOR

BACKGROUND OF THE INVENTION

1. Field of the Invention

The present invention relates to the field of image sensors in use for facsimile or the like equipment, and in paticular, to the field of elongated image sensors now under development instead of IC type image sensors such as MOS photodiode arrays or CCD image sensors.

2. Description of the Prior Art

An elongated image sensor is so constructed that a photoelectric conversion array comprising a plurality of photoelectric conversion elements and a circuit for sequentially switching those elements are formed on a single insulative substrate, and is designed such that the width of the photoelectric conversion element array is sized the same as that of an original. The image on the original is read in the one-to-one image forming manner by an optical system such as an optical fiber array or a lens array. As a result, the optical path length for focusing the image can be shortened, thus enabling the reduction in size of an image reading apparatus.

FIG. 1 shows a circuit diagram of a prior art elongated image sensor, in which the image sensor 1 comprises photoelectric conversion elements 10 of a photoconductive film respectively represented equivalently by a photodiode PD and a capacitor C, switch elements 20 for picking up a signal generated at the photo-electric conversion element 10, capacitance 30 comprised of a parasitic capacitance formed by stray capacitance of the wiring connecting the photoelectric conversion element 10 and the switch element 20 and an input capacitance of the switch element 20, a charge transfer circuit 40, and a load resistor 50. Reference numeral 60 indicates a power supply for biasing. The charge transfer circuit 40 is comprised of charge storage capacitance 41, charge transfer switch elements 42, and clock lines 43 and 44.

When an image on the original is focused on the photoelectric conversion element 10, a photocurrent is generated at the photodiode PD corresponding to the light intensity, and a signal charge is thus stored in capacitance 30. When the switch element 20 is closed by applying a suitable signal to a terminal T1, the signal charge stored in the capacitance 30 is fed to the charge storage capacitance 41. Then as the charge transfer switch elements 42 are sequentially actuated by an alternating voltage applied via terminals T2 and T3 to the clock lines 43 and 44, the signal charge stored in the charge storage capacitance 41 is shifted to the right-hand direction of FIG. 1, eventually applied to the load resistor 50, and outputted through an output terminal T4 as a voltage signal.

As the switch element 20 and the charge transfer switch element 42, MOS transistors produced by ordinary IC technology may be used. The charge transfer circuit 4 of this case is BBD (bucket brigade device).

A MOS transistor is suitable as a switch element of the image sensor due to its features of comparatively high switching speed and the capability of being operated at a low voltage. For realizing the above-mentioned elongated image sensor, it is necessary to mount the switch elements 10 and an IC chip on which the switch elements 20 and the charge transfer circuit 40 are formed on a single substrate and further to connect the above two with each other by such means as wire bonding, causing the increase in the number of connection lines for each image sensor. This fact is a serious problem in producing highly reliable devices at low cost.

As a means for solving the aforementioned problem, it has been proposed that the switch element 20 and the charge transfer circuit 40 be formed of thin film transistors employing semiconductor film. According to this method, since the switch element 20 and the charge transfer circuit 40 are formed by the same film forming process as that for the photoelectric conversion element 10, the above-mentioned connection related problem can be solved favorably.

However, because of slow switching speed compared with the MOS transistor and high voltage required for the actuation of switching operation, the thin film transistor is not satisfactory as a switching element to be applied to such an image sensor, leaving the method imperfect for practical application.

SUMMARY OF THE INVENTION

The present invention, taking the situation given above well into consideration, is directed to provide an image sensor capable of high reliability, high speed original reading through ingenious utilization of the advantages of the thin film transistors and those of the MOS transistors.

More particularly, in the image sensor of the present invention, the thin film transistors are provided in the one-to-one correspondence to the photoelectric conversion element, these thin film transistors being divided into blocks of adjoining ones whose gate electrodes are mutually connected, and the switching signal is sequentially supplied to each of the mutually connected gate electrodes of the same block. Further, the output electrodes of those thin film transistors located in the corresponding positions in each of the odd and even numbered blocks are mutually connected, and the charge transfer circuits comprising the MOS transistors are provided corresponding to respective common connection line groups of odd numbered block and even numbered block. By this construction, at the time of picking up the outputs of the photoelectric conversion elements, the switching period for the film transistors can be retained as long as the original reading time of a plurality of the photoelectric conversion elements corresponding to a plurality of the thin film transistors whose gate electrodes are mutually connected, and therefore the speed of outputting read signal is determined soley by the MOS transistor switching speed. In addition, the number of the connection lines required may be as small as the number of the common connection lines, thus making it possible to achieve the above-mentioned object of the present invention.

In sum, the image sensor of the present invention has the following features:

(1) Capable of stable, high speed reading of image by compensating unsatisfactory characteristics of the thin film resistor.
(2) Enabling the reduction of the number of connection lines required, whereby high operational reliability and low production cost are realized.

BRIEF DESCRIPTION OF THE DRAWING

In the accompanying drawings

FIG. 3 is a timing chart exemplifying the operation of the image sensor shown in FIG. 2; and FIG. 4 is a plan and a sectional view illustrating an example of the construction of the image sensor of the present invention.

DESCRIPTION OF THE PREFERRED EMBODIMENT

Figure 1:
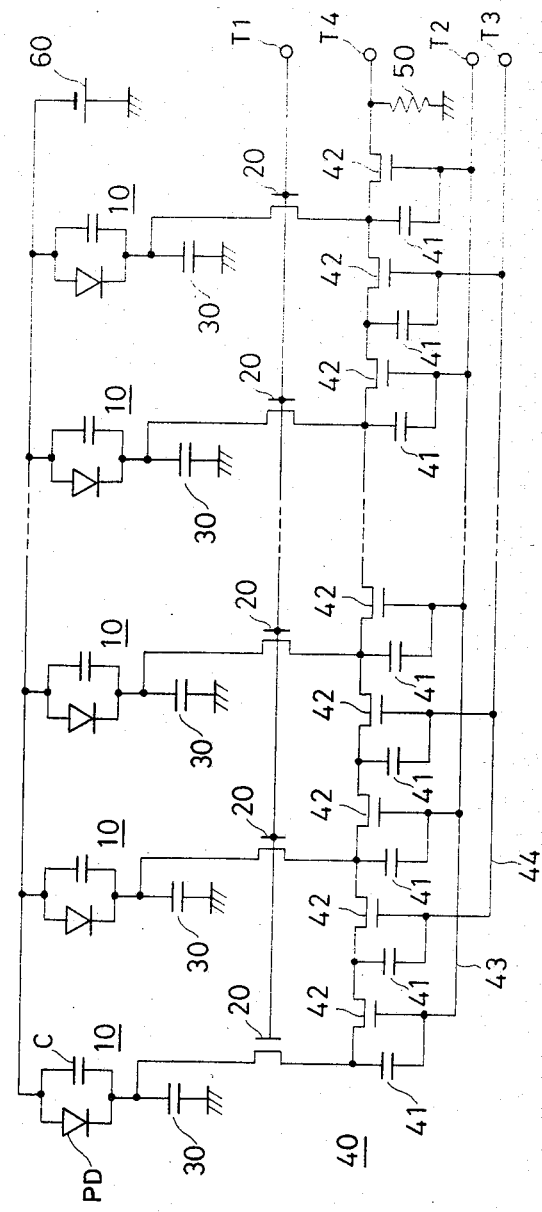
FIG. 1 is an equivalent circuit showing the configuration of a prior art image sensor.
Figure 2:
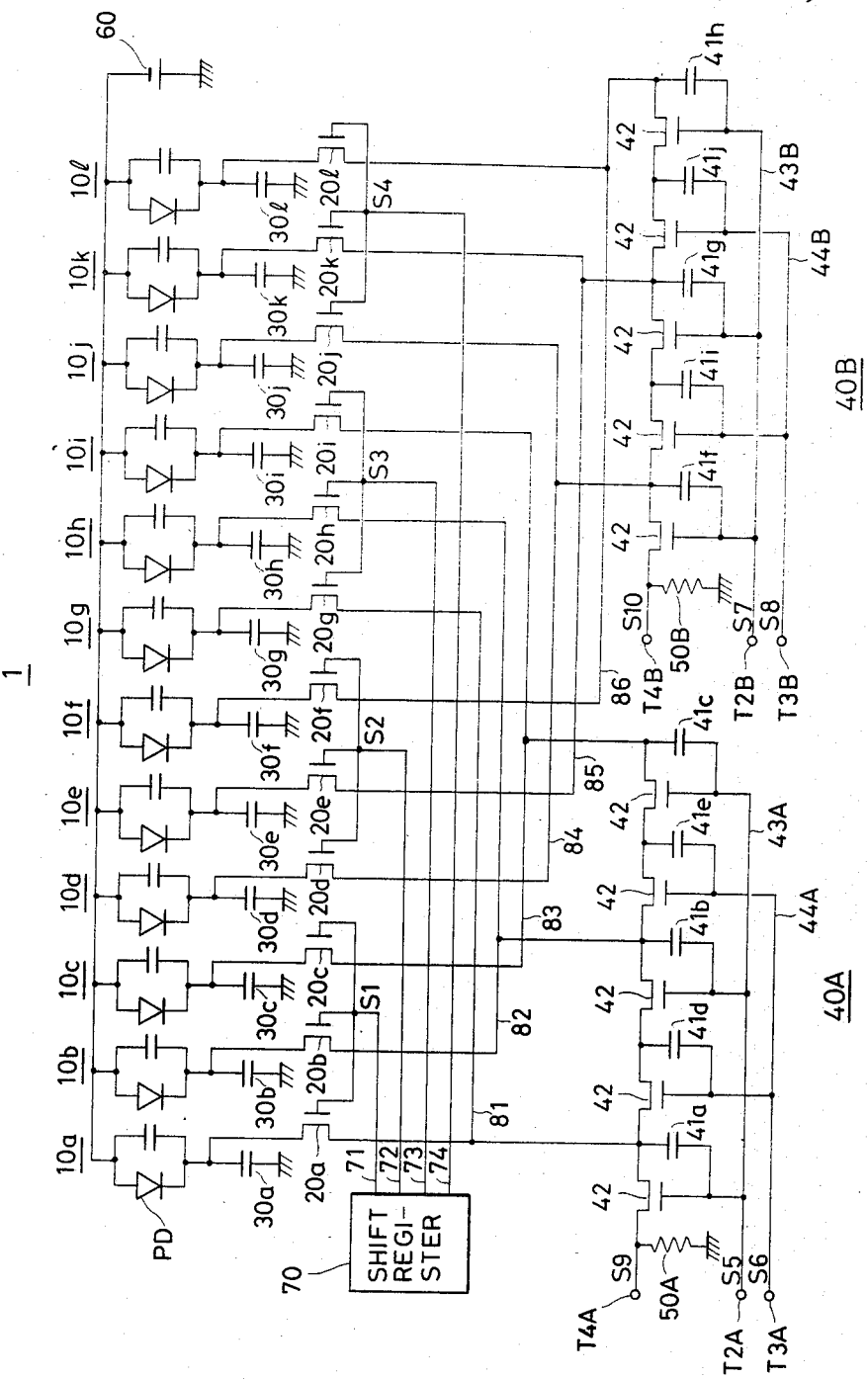
FIG. 2 is an equivalent circuit showing the configuration of an embodiment of the image sensor of the present invention.

FIG. 2 shows an example of circuit configuration of an embodiment of the image sensor of the present invention, in which for the sake of easy explanation, an image sensor 1 has twelve photoelectric conversion elements and the same or corresponding reference numerals and symbols as in FIG. 1 are assigned to the elements or circuits having the same functions as those of FIG. 1.

Referring to FIG. 2, photoelectric conversion elements 10a to 10l are connected in one-to-one correspondence to switch elements 20a to 20l formed of film transistors. These switch elements 20a-20l are divided into four blocks (20a-20c, 20d-20f, 20g-20i, 20j-20l), gate electrodes of the switch elements in the same block are mutually connected and then connected to the output lines 71-74 of a shift register 70 respectively. The output electrodes of the switch elements 20a-20c and 20g-20i which are in the odd numbered blocks are connected to common connection lines 81-83 respectively, while the output electrodes of the switch elements 20d-20f and 20j-20l which are in the even numbered blocks are connected to common connection lines 84-86 respectively. The other ends of these common connection lines 81-83 and the common connection lines 84-86 are connected to charge transfer circuits 40A and 40B respectively.

The device of this embodiment operates basically in such manner that the signal charges stored in capacitance 30a-30l are transferred to charge storage capacitance 41a-41c or 41f-41h of the charge transfer circuits 40A and 40B respectively by the actuation (ON) of the switch elements 20a-20l, and signals are outputted from output terminals T4A and T4B by driving the charge transfer circuits 40A and 40B. In the charge transfer circuits 40A and 40B, MOS transistors are used as charge transfer switch elements 42a-42j.

The above operation will now be described in detail with reference to the timing chart shown in FIG. 3. The operation given below is that to be performed after the signal charge is stored in the capacities 30a-30l.

Firstly, a switching signal S1 is applied to the output line 71 by actuating a shift register 70 (refer to FIG. 3(a)). As a result, the switch elements 20a-20c become ON, and charge accumulated in the capacitance 30a-30c are transferred to the charge storage capacitance 41a-41c through the common connection lines 81-83. It is necessary that the time duration t of the switching signal S1 is sufficiently long for the charge to be transferred. The capacity of the charge storage capacitance 41a-41j is sufficiently large compared with that of the capacitance 30a-30l. Accordingly, after the charge transfer, almost all signal charge can be transferred to the capacitance 41a-41c. Then, the switch elements 20d-20f are turned on by applying a switching signal S2 to the output line 72 of the shift register 70 (refer to FIG. 3(b)), and the signal charge accumulated in the capacitance 30d-30f are transferred to the charge storage capacitance 41f-41h. Simultaneously, clock signals S5 and S6 are supplied from terminals T2A and T2B to clock lines 43A and 44A (refer to FIG. 3(e) and (f)) causing the charge transfer circuit 41A to operate, and the charge accumulated at the capacitance 41a-41c are transferred to the output terminal T4A. That is, the charge transfer switch elements 42a-42c formed of MOS transistors are turned on at the rise of the clock signal S5 at the time t1, the charges in the capacitance 41b and 41c are transferred to the capacitance 41d and 4e, the charge in the capacitance 41a is discharged, and a signal S9 at the time t1 is output from the output terminal T4A. (Refer to FIG. 3(i)). Then, the charge transfer switch elements 42d and 42e are turned on at the rise of the clock signal S6 at the time t2, the charges in the capacitance 41d and 41e are transferred to the capacitance 41a and 41b, and a signal S9 at the time t3 is output from the output terminal T4A by the rise at the time t3 of the clock signal S5. In the same manner, an output signal S9 at the time t5 may be obtained. Then, when the charge transfer circuit 40B is operated similar to the above output signals S10 at times t6-t8 are obtained (refer to FIG. 3(j)), and all signals are read out by the repetition of the similar operation.

As seen in the above, with the device of this embodiment, the operation period t of the switch element 20a-20l may be lengthened sufficiently, therefore, unfavorable characteristics of the film transistor such as slow switching speed and high ON resistance can be compensated. In addition, since MOS transistors whose operation speed is high are employed in the charge transfer circuits 40A and 40B, eventual signal outputting to external circuits can be made quickly and all bits can be read within a short period of time. In addition, Since the switch elements 20a-20l and the common connection lines 81-86 can be formed on the same substrate using the same film as that for the photoelectric conversion element 10 or through the thick film forming process, aforementioned process for connecting with the photoelectric conversion element in one-to-one correspondence is not required. Although connection between the switch elements 20a-20l and the output lines 71-74 of the shift register 70 and between the common connection lines 81-86 and the charge transfer circuits 40A and 40B should be made by wire bonding as so far been practiced, the number of such connections is very small and therefore the above-mentioned problem is unlikely to occur. For example, when the number of the photoelectric conversion elements 10 is 2048 and the photoelectric conversion elements 10 are divided to 32 blocks by common connecting adjoining 64 gates of switch elements 20, the number of the connection lines becomes 128, i.e., about 1/20 of the prior art device shown in FIG. 1.

With reference to FIGS. 4(a) and 4(b) which show the construction of the embodiment device described above, the procedure for fabricating the image sensor will be described in which FIG. 4(b) shows a section taken along line A—A' of FIG. 4(a).

For this device, glass, ceramics, or surface glazed ceramics each having an insulative property is used typically as a substrate 101. Firstly, a metal such as chrome (Cr), gold (Au), aluminum (Al) or nickel (Ni) is deposited in a layer of the thickness about 1000Å to 5000Å on the substrate typically by the electron beam evaporation method, and then a given pattern is formed by photo lithography, thus electrodes 102-104 are obtained. For an better adhesion onto the substrate 101, it is preferred to form the electrode using chrome (Cr).

Then, a photoconductive film 105 and a semiconductor film 106 are formed depositing a semiconductor film of amorphous silicon, polycrystalline silicon, selenium (se)-tellurium (Te), selenium (Se)-arsenic (As), selenium (Se)-arsenic (As)-tellurium (Te), cadmium sulfide (CdS), Cadmium selenide (CdSe), zinc (Zn)-Selenium (Se), or zinc (Zn)-Cadmium (Cd)-tellurium (Te) on the electrodes 103 and 104 by mask evaporation or other suitable method. For this device, it is desirable to form the photoconductive film 105 and the semiconductor film 106 using 0.1 to 1 $\mu$m thick amorphous silicon provided by glow discharge of silane gas ($SiH_4$). Thereafter, a film of ITO ($In_2O_3$, $SnO_2$) 1500Å thick is deposited as a transparent conductive film 107 by the DC spatter or any other suitable method, and is formed into a given shape typically by mask evaporation or photolithography. Thereby the photoelectric conversion element 10 (refer to FIG. 2) is formed at a portion where the electrode 105 and the transparent conductive film 107 overlap. An insulation film 108 typically of silicon dioxide ($SiO_2$), silicon tetranitride ($Si_3N_4$) or glass is formed typically by evaporation photolithography or thick film printing so that through holes are formed to enable multilayer wiring at a given part. Further, by forming a given pattern of thin or thick film typically of chrome (Cr), gold (Au), aluminum (Al) or nickel(Ni) thereon, a gate electrode 109 and common wirings 110 are provided. As a result, a film transistor is formed under the gate electrode 109. To the end of the gate electrode 109 and to the ends of the common wirings 110 the shift register 70 and the charge transfer circuit 40 are connected respectively, thus completing the image sensor of the present invention.

It is apparent that though BBD is used for the embodiment shown in FIG. 2 as the charge transfer circuit 40, CCD (charge coupled device) may likewise be employed.

In addition, though as a method for connecting the shift register 70 and the charge transfer circuit 40, wire bonding alone has been shown, other methods such as soldering connection and tape carrier pressure adhesion (but not limited to) may be applied to this invention.

What is claimed is:

1. An image sensor having photoelectric conversion element's comprising:
   (a) a plurality of bottom layer electrodes disposed on a substrate;
   (b) a photoconductive layer which is disposed on said bottom layer electrodes;
   (c) top layer electrode which is disposed on said photoconductive layer to form a plurality of photoelectric conversion elements;
   (d) a plurality of thin film transistors provided in one-to-one correspondence to said photoelectric conversion elements for switching the outputs of said photoelectric conversion elements, said thin film transistors being divided into odd and even numbered blocks of adjoining thin film transistors, each of said thin film transistors having a gate electrode, the gate electrodes of the transistors in each group of said adjoining thin film transistors in the same block being mutually connected;
   (e) block sequence means for sequentially supplying to the blocks switching signals coupled to the group of mutually connected gate electrodes;
   (f) a first connection line group having outputs and mutually connecting the output electrodes of said thin film transistors located in corresponding positions in each odd numbered block;
   (g) a second connection line group having outputs and mutually connecting the output electrodes of said thin film transistors located in corresponding positions in each even numbered block;
   (h) a first charge transfer circuit comprising MOS transistors for sequentially transferring for each block photoelectric conversion outputs from said first connection line group; and
   (i) a second charge transfer circuit including MOS transistors for sequentially transferring for each block photoelectric conversion outputs from said second connection line group.

2. An image sensor as defined in claim 1 wherein said top layer electrodes comprise transparent electrically conductive material.

3. An image sensor as defined in claim 1 wherein said substrate comprises transparent material and said bottom layer electrodes comprise transparent electrically conductive material.

4. An image sensor as defined in claims 1, 2 or 3 wherein said first and second charge transfer circuits are BBD.

5. An image sensor as defined in claims 1, 2 or 3 wherein said first and second charge transfer circuits are CCD.

6. An image sensor as defined in claims 1, 2 or 3 wherein connection of said first and second connection line groups with said first and second charge transfer circuits is made by wire bonding.

7. An image sensor as in claims 2 or 3 further comprising timer means for alternately causing said first charge transfer circuit to output information while said second charge transfer circuit is receiving an information output from said second connection line group, and causing said second charge transfer circuit to output information while said first charge transfer circuit is receiving an information output from said first connection line group.

* * * * *